US012713696B2

(12) United States Patent
Wang

(10) Patent No.: US 12,713,696 B2
(45) Date of Patent: Aug. 18, 2026

(54) DISPLAY PANEL AND ELECTRONIC TERMINAL

(71) Applicant: Wuhan China Star Optoelectronics Technology Co., Ltd., Wuhan (CN)

(72) Inventor: Lifang Wang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 373 days.

(21) Appl. No.: 18/039,292

(22) PCT Filed: Mar. 31, 2023

(86) PCT No.: PCT/CN2023/085723

§ 371 (c)(1),
(2) Date: May 30, 2023

(87) PCT Pub. No.: WO2024/159615

PCT Pub. Date: Aug. 8, 2024

(65) Prior Publication Data

US 2024/0355832 A1 Oct. 24, 2024

(30) Foreign Application Priority Data

Feb. 3, 2023 (CN) ......................... 202310099747.6

(51) Int. Cl.
*H10D 86/40* (2025.01)

(52) U.S. Cl.
CPC ... *H10D 86/441* (2025.01); *G09G 2310/0297* (2013.01); *G09G 2320/0233* (2013.01)

(58) Field of Classification Search
CPC ......... H10D 86/441; G09G 2310/0297; G09G 2320/0233
See application file for complete search history.

(56) References Cited

U.S. PATENT DOCUMENTS

| | | | |
|---|---|---|---|
| 8,106,449 | B2 | 1/2012 | Sano et al. |
| 10,854,124 | B2 | 12/2020 | Yang et al. |
| 11,264,411 | B2 | 3/2022 | Su et al. |
| 11,758,735 | B2 | 9/2023 | Lin et al. |

(Continued)

FOREIGN PATENT DOCUMENTS

| | | |
|---|---|---|
| CN | 1933178 | 3/2007 |
| CN | 101110430 | 1/2008 |

(Continued)

OTHER PUBLICATIONS

Notification of Office Action and Search Report Dated Apr. 11, 2025 From The State Intellectual Property Office of the People's Republic of China Re. Application No. 202310099747.6 and Its Translation Into English. (34 Pages).

(Continued)

*Primary Examiner* — Peter M Albrecht

(57) ABSTRACT

A display panel and an electronic terminal are provided. A longer first data line and a shorter second data line are arranged in a display area, source lines are arranged in a non-display area, a first transistor and a second transistor are connected to the respective source lines (the first transistor is also connected to the first data line to form a higher first rated capacitance, and the second transistor is also connected to the second data line to form a lower second rated capacitance).

12 Claims, 3 Drawing Sheets

(56) References Cited

U.S. PATENT DOCUMENTS

| | | | |
|---|---|---|---|
| 2008/0017859 | A1 | 1/2008 | Tai et al. |
| 2021/0066353 | A1 | 3/2021 | Su et al. |
| 2022/0271048 | A1 | 8/2022 | Lin et al. |
| 2022/0336269 | A1 | 10/2022 | Tseng et al. |
| 2024/0379412 | A1 | 11/2024 | Tseng et al. |
| 2025/0040143 | A1 | 1/2025 | Lin et al. |

FOREIGN PATENT DOCUMENTS

| | | | | |
|---|---|---|---|---|
| CN | 104898340 | | 9/2015 | |
| CN | 104898340 A | * | 9/2015 | ........... G09G 3/3648 |
| CN | 107221536 | | 9/2017 | |
| CN | 107301850 | | 10/2017 | |
| CN | 108682373 | | 10/2018 | |
| CN | 109521616 | | 3/2019 | |
| CN | 109904214 | | 6/2019 | |
| CN | 110400811 | | 11/2019 | |
| CN | 110854205 | | 2/2020 | |
| CN | 111599862 | | 8/2020 | |
| CN | 113937157 | | 1/2022 | |
| CN | 215526311 | | 1/2022 | |
| CN | 114628402 | | 6/2022 | |
| CN | 114975257 | | 8/2022 | |
| CN | 115172329 | | 10/2022 | |
| JP | WO 2017/010286 | | 3/2018 | |

OTHER PUBLICATIONS

Notification of Office Action and Search Report Dated Jan. 13, 2025 From The State Intellectual Property Office of the People's Republic of China Re. Application No. 202310099747.6 and Its Translation Into English. (24 Pages).

International Search Report and the Written Opinion Dated Jul. 15, 2023 From the International Searching Authority Re. Application No. PCT/CN2023/085723. (14 Pages).

* cited by examiner

DISPLAY PANEL AND ELECTRONIC TERMINAL

RELATED APPLICATIONS

This application is a National Phase of PCT Patent Application No. PCT/CN2023/085723 having International filing date of Mar. 31, 2023, which claims the benefit of priority of Chinese Patent Application No. 202310099747.6 filed on Feb. 3, 2023. The contents of the above applications are all incorporated by reference as if fully set forth herein in their entirety.

FIELD OF DISCLOSURE

The present invention relates to a field of display technology, in particular to production of display devices, and specifically, to display panels and electronic terminals.

DESCRIPTION OF RELATED ART

Display terminals need to have various structural designs to satisfy the requirements for usage scenarios. Therefore, research has been carried out on special-shaped screens of medium and large-sized displays.

In order to reduce the number of output pins of source drivers to reduce a width of a lower border, a demultiplexer circuit is generally disposed between the source driver and a display area. However, for medium and large-sized display screens, special-shaped and large sized screens cause a significant difference between lengths of two data lines in at least two farther areas. A rated capacitance is formed between the data line and the demultiplexer circuit in the display area. Therefore, whenever signals in the demultiplexer circuit change, there is a large difference in voltage jump on the data lines with a significant difference in length, which causes brightness to jump by greatly different amounts in the corresponding areas.

Therefore, for conventional medium and large-sized displays having special-shaped screens, there is an urgent need to solve a problem that brightness jumps by greatly different amounts in different areas of the display screen when signals change in the demultiplexer circuit.

SUMMARY OF INVENTION

Technical Problem

It is an objective for the present application to provide a display panel and an electronic terminal to solve a problem in medium and large-sized special-shaped display screens that brightness jumps by greatly different amounts in different areas of the display screen when signals change in a demultiplexer circuit.

Solution to Problem

The present invention provides a display panel, including a display area and a non-display area disposed on at least one side of the display area;

a plurality of data lines disposed in the display area, the data lines comprising a first data line and a second data line, wherein a length of the first data line is greater than a length of the second data line;

a plurality of source lines disposed in the non-display area; and a plurality of demultiplexers disposed in the non-display area and connected between the source lines and the data lines, wherein each of the demultiplexers comprises multiple transistors;

wherein each of the transistors comprises a drain and a gate; the transistors comprise a first transistor connected to a first data line, and a second transistor connected to a second data line, a first rated capacitance is formed between the first data line and the gate of the first transistor, a second rated capacitance is formed between the second data line and the gate of the second transistor, and the first rated capacitance is higher than the second rated capacitance.

Beneficial Effect

The present invention provides a display panel and an electronic terminal. The first rated capacitance formed between the first data line and the gate of the first transistor is higher than the second rated capacitance formed between the second data line and the gate of the second transistor. Therefore, when the voltage of the gate of the transistor jumps, the voltage jump on the first data line is close to or substantially equal to the voltage jump on the second data line, thereby preventing a big difference in brightness jump between the corresponding two different areas in the display panel and improving the uniformity of the display screen of the display panel.

BRIEF DESCRIPTION OF DRAWINGS

The present application will be described with reference to the accompanying drawings. It should be noted that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
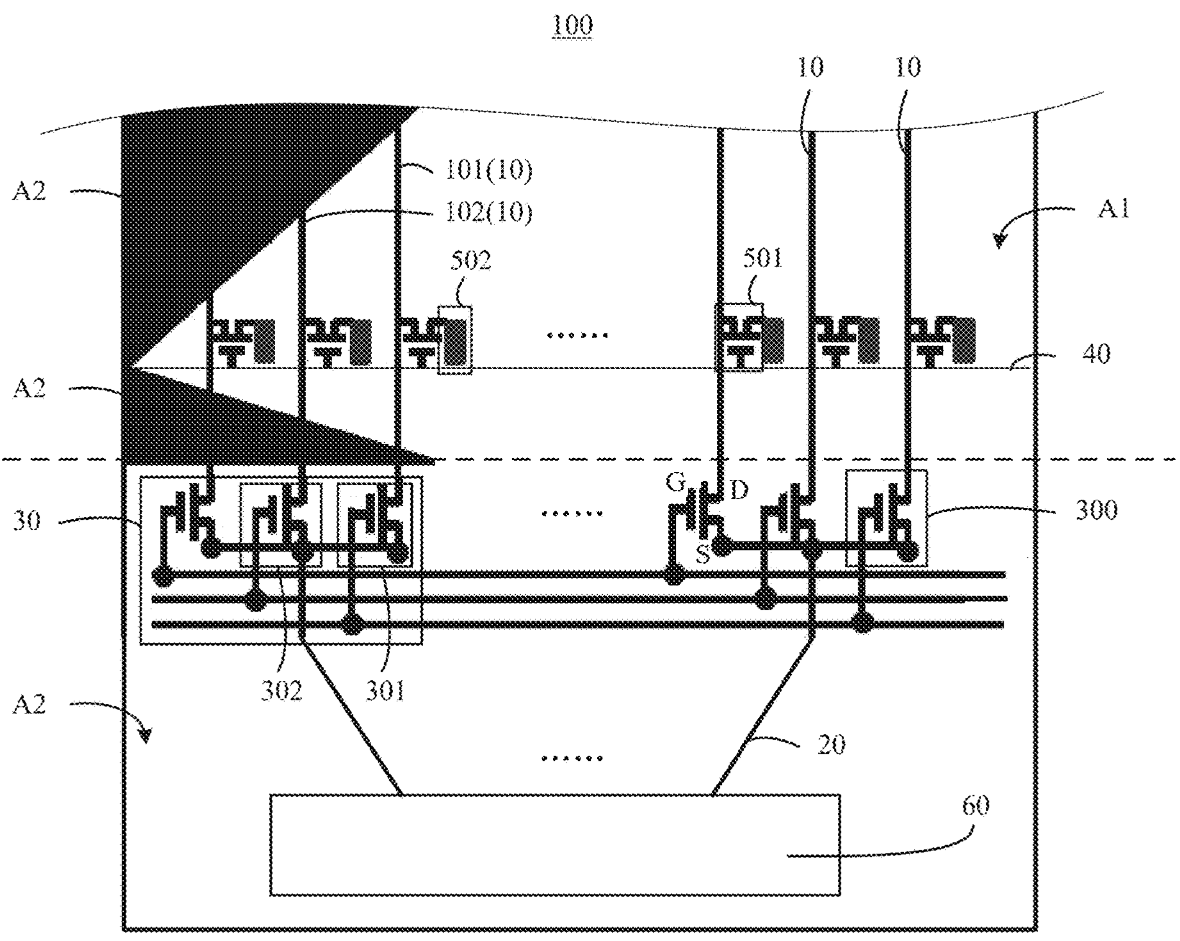
FIG. 1 is a schematic top view illustrating a display panel according to one embodiment of the present invention.

The technical solutions of the present invention are clearly and completely described with reference to the accompanying drawings and in conjunction with specific embodiments. Apparently, the described embodiments are only some of the embodiments of the present invention, but not all of them. Based on the embodiments of the present invention, all other embodiments obtained by those skilled in the art without creative efforts fall within the protection scope of the present invention.

In the description of the present invention, it should be understood that the orientations or positional relationships indicated by the terms “corresponding”, “upper” and “lower” are based on the orientations or positional relationships shown in the drawings, and the above orientations or positional relationships are only for the convenience of describing the present invention and simplifying the description, but do not indicate or imply that the referred device or element must have a specific orientation, be constructed and operated in a specific orientation, and thus should not be construed as limiting the present invention.

In addition, the terms "first", "second", etc. are used for illustrative purposes only, and should not be understood as indicating or implying relative importance or implicitly specifying the quantity of the indicated technical features. Thus, a feature defined as "first" or "second" may explicitly or implicitly include one or more of said features. In the description of the present invention, "multiple" means two or more, unless otherwise clearly and specifically defined. The wording "electrically connected" means that there is electrical conduction between two elements, but is not limited to direct connection or indirect connection. In addition, it should be noted that the accompanying drawings only show structures that are closely related to the present invention, but omit some details that are not closely related to the invention. The device is exactly the same as the accompanying drawings, and is not used as a limitation of the actual device.

The present invention provides a display panel. The display panel may include, but is not limited to, the following embodiments and combinations of the following embodiments.

In one embodiment, as shown in FIG. 1, the display panel 100 includes: a display area A1 and a non-display area A2 arranged on at least one side of the display area A1; a plurality of data lines 10 arranged in the display area A1, wherein the data lines 10 include a first data line 101 and a second data line 102, and a length of the first data line 101 is greater than a length of the second data line 102; a plurality of source lines 20 disposed in the non-display area A2; a plurality of demultiplexers 30 disposed in the non-display area A2 and connected between the source lines 20 and the data lines 10, wherein each of the demultiplexers 30 includes multiple transistors 300. Each of the transistors includes a source S, a drain D, and a gate G. The transistors 300 of the demultiplexers 30 include a first transistor 301 connected to the first data line 101 and a second transistor 302 connected to the second data line 102, as shown in FIG. 1 to FIG. 5. A first rated capacitance Cgd1 is formed between the first data line 101 and the gate G of the first transistor 301. A second rated capacitance Cgd2 is formed between the second data line 102 and the gate G of the second transistor 302. A capacitance value of the first rated capacitance Cgd1 is greater than a capacitance value of the second rated capacitance Cgd2. The transistors 300 of each demultiplexer 30 are configured to be turned on sequentially to sequentially couple the corresponding multiple data lines 10 to the corresponding source line 20.

Specifically, as shown in FIG. 1, the display panel 100 can further include a plurality of gate lines 40 disposed in the display area A1, the gate lines 40 intersecting with the plurality of data lines 10 to define a plurality of pixel regions. Each pixel region is provided with a pixel driving circuit 501 and a sub-pixel electrode 502. The pixel driving circuit 501 can include, but is not limited to, a driving transistor. Further, each gate line 40 can be connected to gates of the corresponding driving transistors, and each data line 10 can be connected to sources of the corresponding driving transistors. A drain of each driving transistor can be connected to the corresponding sub-pixel electrode 502. Each of the gate lines 40 take turns getting loaded with an effective gate voltage to turn on the corresponding driving transistors, so that each of the data lines 10 takes turns getting electrically connected to the corresponding sub-pixel electrode 502, and when the corresponding driving transistor is turned off, each sub-pixel electrode 502 can also form a storage capacitor to maintain its own electric signal to achieve a complete screen display.

Further, as shown in FIG. 1, in the same demultiplexer 30, the sources S of the transistors 300 are connected to the corresponding source line 20, and the drains D of the transistors 300 are respectively connected to the corresponding data lines 10. The display panel 100 can also include a source driver 60 located in the non-display area A2 to provide data signals for the data lines 10. The source driver 60 has limited output pins, but there are more data lines 10, so the demultiplexers 30 can be provided between the data lines 10 and the source lines 20 connected to the output pins of the source driver 60. The wording "coupling" refers to transmitting (or transferring) the energy of a certain circuit to another circuit. In the present embodiment, "coupling" can be understood as establishing electrical connection. That is to say, after any transistor 300 is turned on, a closed circuit is formed between the source line 20 connected to the demultiplexer 30 and the corresponding data line 10, so as to transmit signals of the source line 20 to the corresponding data line 10.

Specifically, during a period when any gate line 40 is loaded with an effective gate voltage, the source driver 60 can store multiple data signals corresponding to the respective sub-pixel electrodes 502. Further, as the transistors 300 of each demultiplexer 30 are turned on sequentially (the next transistor 300 is turned on after the current transistor 300 is turned off to prevent any two transistors 300 of the same demultiplexer 30 from being turned on at the same time), multiple data signals for the same demultiplexer 30 in the source driver 60 are sequentially transmitted to the source line 20 and are further transmitted sequentially to the corresponding data lines 10 connected to the respective transistors 300 sequentially turned on, so that the data signals can be loaded to the respective corresponding sub-pixel electrodes 502. In other words, the data signal loaded on each sub-pixel electrode 502 is output from the source driver 60 and passes through the corresponding transistor 300 in the demultiplexer 30 and then passes through the corresponding driving transistor to be loaded to the sub-pixel electrode 502.

For each transistor 300, the gate G of the transistor 300 and the data line 10 which has constant electrical connection with the drain D of the transistor 300 are made of conductive materials, and a distance between the gate G and the data line 10 is relatively close, so a rated capacitance Cgd is formed. When any transistor 300 of the demultiplexer 30 is switched from an ON state to an OFF state, a voltage of the gate G of the transistor 300 jumps from a turn-on voltage Vg1 to a turn-off voltage Vg2. In this case, because a voltage difference between two ends of a capacitor cannot be changed suddenly, a voltage on the drain D of the transistor 300 and a voltage on the data line 10 also has a voltage jump ΔVp. At this point, the corresponding gate line 40 can still be loaded an effective gate voltage, so a data voltage loaded on the sub-pixel electrode 502 corresponding to the transistor 300 also jump, causing brightness of the corresponding region to jump. $\Delta Vp = Cgd/Ctotal*(Vgh-Vg1)$, wherein Ctotal can be understood as a total capacitance formed by the data line 10 and the corresponding conductive structure in the display panel 100. That is to say, the voltage jump ΔVp on the drain D of the transistor 300 and the data line 10 caused by the voltage jump of the gate G of the transistor 300 is at least related to the above-mentioned rated capacitance Cgd and the total capacitance of the data line 10. Vgh is the higher voltage selected from the turn-on voltage Vg1 and the turn-off voltage $Vg2$ of the gate G, and $Vg1$ is the lower voltage selected from the turn-on voltage $Vg1$ and the turn-off voltage $Vg2$ of the gate G.

Please refer to FIG. 1. It should be noted that, in the present invention, the non-display area A2 of the display panel 100 has a special (or irregular) shape. Therefore, the data lines 10, in an area corresponding to the special shape, in the display area A1, are different in length. For example, a length of the first data line 101 is greater than a length of the second data line 102. As explained above, the data line 10 has the voltage jump $\Delta Vp$, and the total capacitance Ctotal of the data line 10 is positively correlated to the length of the data line 10. Therefore, the total capacitance $Ctotal1$ of the first data line 101 is greater than the total capacitance $Ctotal2$ of the second data line 102. If the rated capacitances Cgd of the first data line 101 and the second data line 102 are the same, the voltage jump $\Delta Vp1$ on the first data line 101 is less than the voltage jump $\Delta Vp2$ on the second data line 102.

In the present embodiment, the first rated capacitance $Cgd1$ formed between the first data line 101 and the gate G of the first transistor 301 is set to be higher than the second rated capacitance $Cgd2$ formed between the second data line 102 and the gate G of the second transistor 302. As explained above, the data line 10 has the voltage jump $\Delta Vp$, and the total capacitance $Ctotal1$ of the first data line 101 is higher than the total capacitance $Ctotal2$ of the second data line 102. Therefore, in the present embodiment, the first rated capacitance $Cgd1$ and the total capacitance $Ctotal1$ of the first data line 101 are both higher at the same time, and the second rated capacitance $Cgd2$ and the total capacitance $Ctotal2$ of the second data line 102 is both lower at the same time. Consequently, $Cgd1/Ctotal1$ is close to $Cgd2/Ctotal2$, resulting in that the voltage jump $\Delta Vp1$ on the first data line 101 is close to the jump voltage $\Delta Vp2$ on the second data line 102, so as to prevent a great difference in brightness jump between two different areas in the display panel 100, and realize a uniform display of the display panel 100.

Further, based on the above embodiment, the following embodiment can also be obtained. For multiple data lines 10 whose lengths increase sequentially (that is to say, the respective corresponding total capacitances Ctotal also increase sequentially), the rated capacitances Cgd formed between the data lines 10 and the gates G of the respective corresponding transistors 300 can be set to increase sequentially. A ratio of the rated capacitance Cgd corresponding to any one of the data lines 10 to the corresponding total capacitance Ctotal can be used as a reference value, and the rated capacitances Cgd corresponding to other data lines 10 are reasonably set such that the ratio of the rated capacitance Cgd corresponding to each data line 10 to the corresponding total capacitance Ctotal is also close to the reference value. Certainly, it is also possible to set the ratio of the rated capacitance Cgd corresponding to each data line 10 to the corresponding total capacitance Ctotal to be equal to the reference value. Of course, when the lengths of the two data lines 10 are the same, the rated capacitances Cgd of the two data lines can also be the same.

Figure 2:
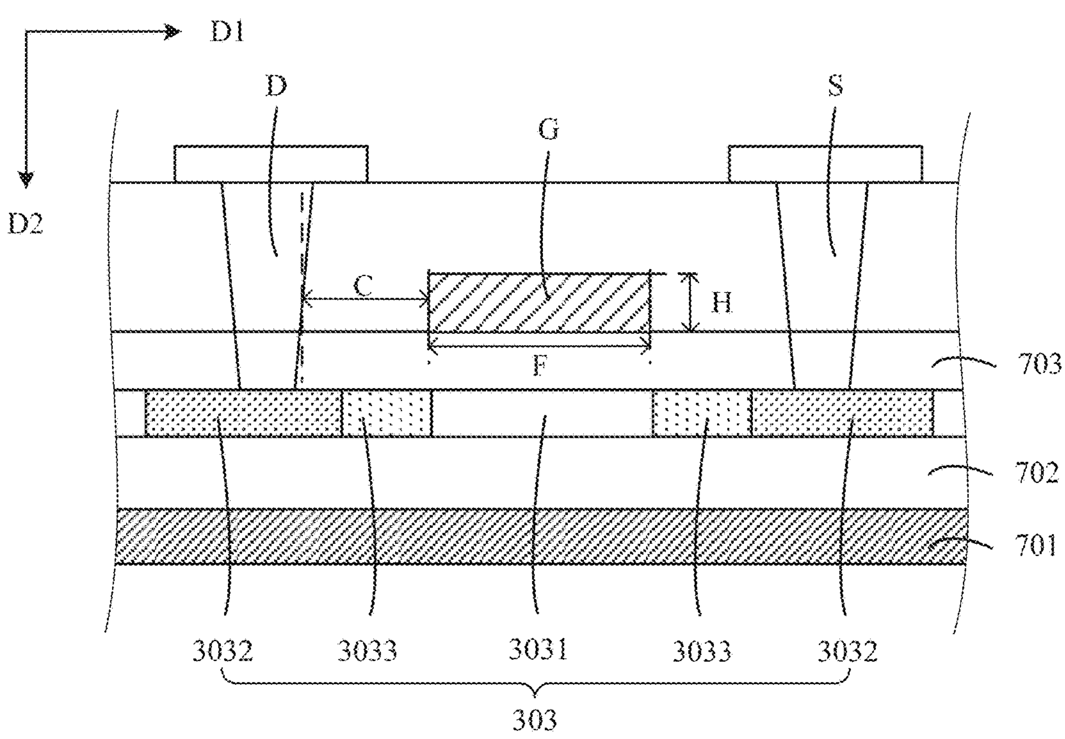
FIG. 2 is a schematic cross-sectional view illustrating an area having a transistor in the display panel according to a first embodiment of the present invention.
Figure 3:
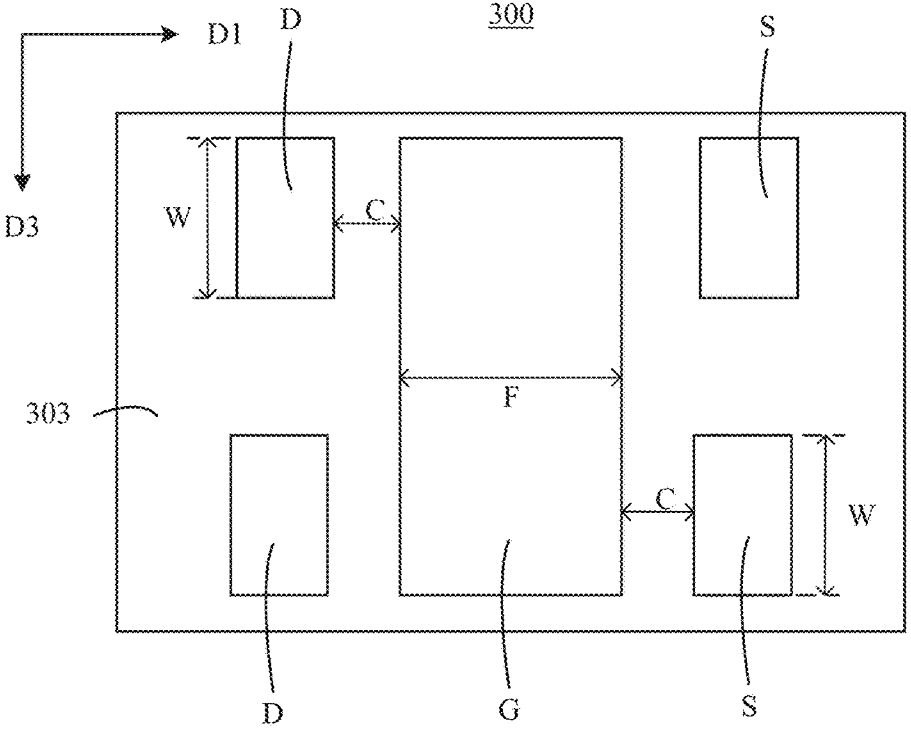
FIG. 3 is a schematic top view corresponding to FIG. 2.
Figure 4:
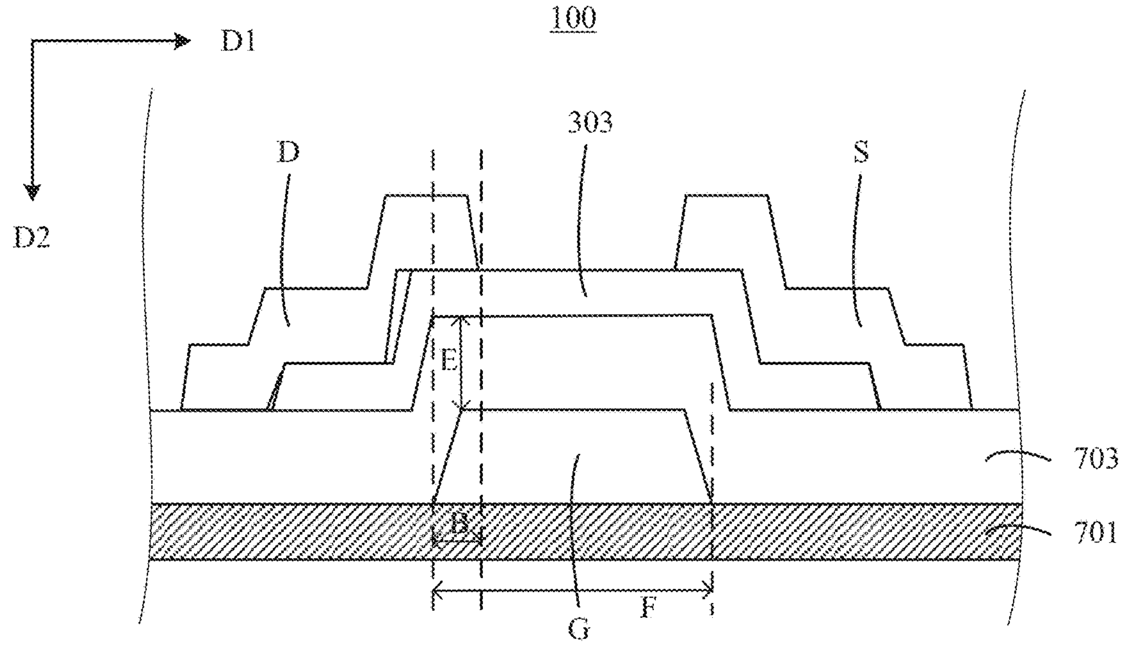
FIG. 4 is a schematic cross-sectional view illustrating an area having a transistor in the display panel according to a second embodiment of the present invention.
Figure 5:
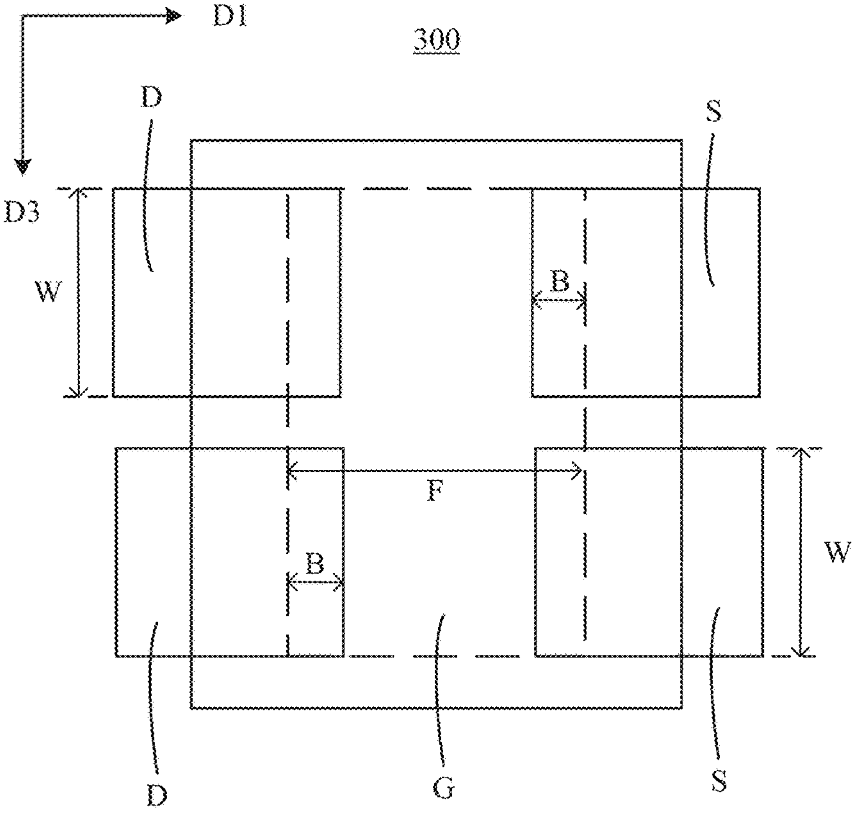
FIG. 5 is a schematic top view corresponding to FIG. 4.

In one embodiment, as shown in FIG. 1 to FIG. 5, an overlapping area between the drain D and the gate G of the first transistor 301 in an area where the drain D and the gate G are arranged face to face is larger than an overlapping area between the drain D and the gate G of the second transistor 302 in an area where the drain D and the gate G are arranged face to face. Specifically, whether the transistor 300 is a top-gate structure (as shown in FIG. 2 and FIG. 3) or a bottom-gate structure (as shown in FIG. 4 and FIG. 5), there is an overlapping area between the gate G and the source S of the transistor 300 in an area where the gate G and the source S are arranged face to face, and there is also an overlapping area between the gate G and the drain D of the transistor 300 in an area where the gate G and the drain D are arranged face to face. That is to say, a parallel-plates structure is formed. The rated capacitance Cgd discussed above is formed between the gate G of the transistor 300 and the data line 10 which has a constant electrical connection with the drain D of the transistor 300. Since the data line 10 has constant electrical connection with the drain D of the transistor 300, it can also be considered that the rated capacitance Cgd is formed between the gate G and the drain D of the transistor 300. A capacitance formula is given as $C=\varepsilon S/d$ ($\varepsilon$ is a dielectric constant of a medium between the plates, $\varepsilon=\varepsilon r\varepsilon 0$, $\varepsilon 0=\frac{1}{4}\pi k$, S is an area of the plate, and d is a distance between the plates). Accordingly, it can be known that the larger the overlapping area between the gate G and the drain D of the transistor 300 is, the larger the corresponding rated capacitance Cgd is.

In the present embodiment, the overlapping area of the drain D and the gate G of the first transistor 301 is set to be larger than the overlapping area of the drain D and the gate G of the second transistor 302. Hence, the "parallel-plates structure" mentioned above can make the first rated capacitance $Cgd1$ greater than the second rated capacitance $Cgd2$, so that the voltage jump $\Delta Vp1$ on the first data line 101 is close to the voltage jump $\Delta Vp2$ on the second data line 102, thereby preventing a great difference in brightness-jump between two different areas in the display panel 100, and improving uniformity of the display screen of the display panel 100.

In one embodiment, as shown in FIG. 2 to FIG. 5, the display panel 100 further includes: a substrate 701 on which transistors 300 are disposed. In the transistor 300, the gate G, the drain D, and the active portion 303 are arranged in different layers. In a horizontal direction D1 of a cross section of the display panel 100, the source S and the drain D of the transistor 300 are arranged close to two ends of the active portion 303 respectively. Specifically, both the active portion 303 of the top-gate structure and the active portion 303 of the bottom-gate structure include a channel portion 3031 and two doped portions (only schematically illustrated in FIG. 2) located at two sides of the channel portion 3031. Each doped portion includes a heavily doped portion 3032 and includes a lightly doped portion 3033 located between the heavily doped portion 3032 and the channel portion 3031. A concentration of the doped particles in the heavily doped portion 3032 is greater than a concentration of the doped particles in the lightly doped portion 3033.

The substrate 701 can include a single-layer insulating material such as glass, quartz, and polymer resin, or can include a multi-layer insulating material such as a double-layer polymer resin. The substrate 701 can be a rigid substrate or a flexible substrate. Further, a buffer layer 702 (only shown in FIG. 2) can be provided between the substrate 701 and the transistors 300. A material of the buffer layer 702 can include at least one of silicon nitride or silicon oxide. A gate insulating layer 703 can be disposed between the gate G and the active portion 303. A material of the gate insulating layer 703 can include at least one of silicon compound or metal oxide. As shown in FIG. 2 and FIG. 3, the source S and the drain D can be connected to the active portion 303 through via holes. In one example as shown in FIG. 4 and FIG. 5, the source S and the drain D can be directly connected to the active portion 303.

In one embodiment, as shown in FIG. 1 to FIG. 3, in a vertical direction D2 of the cross section of the display panel 100, the gate G of the transistor 300 is located between the drain D and the active portion 303, and the drain D extends along the vertical direction D2 to contact with one end of the active portion 303. In the horizontal direction D1 of the cross section of the display panel 100, an area of an orthographic projection of the gate G of the first transistor 301 projected on the drain D of the first transistor 301 is larger than an area of an orthographic projection of the gate G of the second transistor 302 projected on the drain D of the second transistor 302.

Specifically, as discussed above, each of the first transistor 301 and the second transistor 302 includes the active portion 303, the gate G located on one side of the active portion 303, and the drain D located on one side of the gate G away from the active portion. The drain D includes a first portion and a second portion connected between the first portion and the active portion 303. An area of an orthographic projection of the gate G of the first transistor 301 projected on the corresponding second portion is larger than an area of an orthographic projection of the gate G of the second transistor 302 projected on the corresponding second portion.

It should be noted that, as discussed above, the source S and the drain D can extend to fill the via holes, so as to be connected to the active portion 303. Further, as shown in FIG. 2, in a direction in which the source S and the drain D extend (that is, the vertical direction D2), when the gate G has an orthographic projection on the drain D, the gate G and the drain D can form a parallel-plates structure to form the rated capacitance Cgd, as shown in FIG. 2 and FIG. 3. That is to say, the rated capacitance Cgd can be formed between a lateral side of the gate G and a lateral side of the drain D.

It can be understood that in the present embodiment, in the horizontal direction D1, the area of the orthographic projection of the gate G of the first transistor 301 projected on the drain D of the first transistor 301 is set to be larger than that the area of the orthographic projection of the gate G of the second transistor 302 projected on the drain D of the second transistor 302. That is to say, a face to face area between the lateral side of the gate G and the lateral side of the drain D of the first transistor 301 is set to be larger, so that the first rated capacitance Cgd1 can be greater than the second rated capacitance Cgd2, and thus the voltage jump ΔVp1 on the first data line 101 is close to the jump voltage ΔVp2 on the second data line 102, thereby preventing a big difference in brightness jump between the corresponding two areas in the display panel 100, and improving the uniformity of the display screen of the display panel 100.

Specifically, referring to FIG. 1 to FIG. 3, a thickness H of the gate G of the first transistor 301 is greater than a thickness H of the gate G of the second transistor 302. In a front view of the lateral side of the gate G of the transistor 300, the "thickness H of the gate G" mentioned in this embodiment can be understood as a width of the lateral side of the gate G. It can be understood that, as shown in FIG. 2, since the thickness of the drain D (including a portion of the drain D located in the via hole) is greater than the thickness H of the gate G. Therefore, by making the lateral side of the gate G of the first transistor 301 have a greater width in the front view of the lateral side of the gate G of the first transistor 301, the present application has a larger face-to-face area between the lateral side of the gate G and the lateral side of the drain D of the first transistor 301, so that the first rated capacitance Cgd1 can be higher than the second rated capacitance Cgd2. The thickness H of the gate G can be configured as described above by, but not limited to, processes such as evaporation and photolithography. For example, a top of the gate G of the first transistor 301 can be provided with a plurality of grooves to make the gate G of the first transistor 301 have a smaller thickness.

Similarly, referring to FIG. 1 to FIG. 3, in the direction D3 perpendicular to the cross section of the display panel 100, a dimension W of the drain D of the first transistor 301 is greater than a dimension W of the drain D of the second transistor 302. That is to say, a thickness of the drain D of the first transistor 301 is greater than a thickness of the drain D of the second transistor 302. In the front view of the lateral side of the gate G of the transistor 300, the "dimension W of the drain D in the direction D3" mentioned in this embodiment can be understood as a length of the lateral side of the gate G. Specifically, taking manufacturing processes and other factors into consideration, it should be noted that, in FIG. 3, along the direction D3, the dimension W of the drain D is generally smaller than a dimension of the gate G. For example, multiple sources S and multiple drains D can be arranged in the direction D3. That is to say, a dimension of the drain D of the first transistor 301 in the direction D3 can be understood as "one of the drains D having the dimension W in the direction D3". Therefore, by making greater the dimension W of the drain D of the first transistor 301 in the direction D3, the lateral side of the gate G of the first transistor 301 and the lateral side of the drain D of the first transistor 301 also have a larger face-to-face area, so that the first rated capacitance Cgd1 is greater than the second rated capacitance Cgd2.

Referring FIG. 1 to FIG. 3, according to one embodiment, in the horizontal direction D1 of the cross section of the display panel 100, a distance C between the gate G and the drain D of the first transistor 301 is less than a distance C between the gate G and the drain D of the second transistor 302. Likewise, based on above discussion, it can be known that the rated capacitance Cgd can be formed between the lateral side of the gate G and the lateral side of the drain D. In this embodiment, the distance C between the gate G and the drain D of the first transistor 301 is set to be relatively small. According to the above discussion in regard to the "parallel-plates structure", it can be known that a small distance d between the plates (electrode plates) causes the first rated capacitance Cgd1 to be greater than the second rated capacitance Cgd2, so that the voltage jump ΔVp1 on the first data line 101 can be close to the voltage jump ΔVp2 on the second data line 102, thereby preventing a big difference in brightness jump between the two corresponding areas in the display panel 100, and improving the uniformity of the display screen of the display panel 100.

Specifically, as discussed above, the gate G is located on one side of the corresponding active portion 303 away from the substrate 701. The distance between the gate G and the drain D of the first transistor 301 in a direction from the gate G of the first transistor 301 to the corresponding second portion is less than the distance between the gate G and the drain D of the second transistor 302 in a direction from the gate G of the second transistor 302 to the corresponding second portion.

Referring to FIG. 1, FIG. 4, and FIG. 5, in one embodiment, an overlapping area of orthographic projections of the drain D and the gate G of the first transistor 301 projected on the substrate 701 is larger than an overlapping area of orthographic projections of the drain D and the gate G of the second transistor 302 projected on the substrate 701. Specifically, the source S and the drain D can be arranged corresponding to the doped portion of the active portion 303. Further, in this embodiment, the gate G can be arranged corresponding to the channel portion 3031 of the active portion 303 and extends in the horizontal direction D1 in a manner such that orthographic projections of the drain D and the gate G projected on the substrate 701 overlap each other. Therefore, the drain D and the gate G can form a parallel-plates structure to form the rated capacitance Cgd, as shown in FIGS. 4 and 5. In other words, the rated capacitance Cgd is formed between an upper surface of the gate G and a lower surface of the drain D.

Specifically, the gate G is located on one side of the corresponding active portion 303 close to the substrate 701. An overlapping area of the drain D and the gate G of the first transistor 301 is larger than an overlapping area of the drain D and the gate G of the second transistor 302.

It can be understood that in the present embodiment, the overlapping area of the orthographic projections of the drain D and gate G of the first transistor 301 projected on the substrate 701 is larger than the overlapping area of the orthographic projections of the drain D and gate G of the second transistor 302 projected on the substrate 701. In other words, a face-to-face area between the upper surface of the gate G and the lower surface of the drain D of the first transistor 301 is larger, so that the first rated capacitance Cgd1 is greater than the second rated capacitance Cgd2, and as a result, the voltage jump ΔVp1 on the first data line 101 is close to or substantially equal to the voltage jump ΔVp2 on the second data line 102, thereby preventing a difference in brightness jump between the two corresponding different areas in the display panel 100 and improving the uniformity of the display screen of the display panel 100.

Specifically, referring to FIG. 1, FIG. 4, and FIG. 5, in the horizontal direction D1 of the cross section of the display panel 100, a dimension B of an orthographic projection of the drain D of the first transistor 301 projected on the gate G of the first transistor 301 is greater than a dimension B of an orthographic projection of the drain D of the second transistor 302 projected on the gate G of the second transistor 302. Speaking of the orthographic projection of the drain D of the transistor 300 projected on the gate G, "the dimension B of the projection in the horizontal direction D1" mentioned in this embodiment can be understood as a length of an overlapping area of the drain D and the gate G in the horizontal direction D1. It can be understood that, as shown in FIG. 4, since the orthographic projections of the drain D and the gate G projected on the substrate 701 overlap, an upper surface of the gate G of the first transistor 301 and a lower surface of the drain D have a larger face-to-face area by making greater the dimension B of the orthographic projection of the drain D of the first transistor 301 projected on the gate G of the first transistor 301. Such configuration also realizes that the first rated capacitance Cgd1 is higher than the second rated capacitance Cgd2.

It is discussed above that in the direction from the gate G of the first transistor 301 to the corresponding second portion, the orthographic projection of the drain D of the first transistor 301 projected on the gate G of the first transistor 301 is larger than the orthographic projection of the drain D of the second transistor 302 projected on the gate G of the second transistor 302.

Similarly, with reference to FIG. 1, FIG. 4, and FIG. 5, in the direction D3 perpendicular to the cross section of the display panel 100, a dimension W of the drain D of the first transistor 301 is greater than a dimension W of the drain D of the second transistor 302. Speaking of the orthographic projection of the drain D of the transistor 300 projected on the gate G, "the dimension W of the drain D in the direction D3" mentioned in this embodiment can be understood as a length of the lateral side of the gate G. Specifically, taking manufacturing processes and other factors into consideration, it should be noted that in the direction D3 as shown in FIG. 5, the dimension W of the drain D is generally smaller than a dimension W of the gate G. In an example, multiple sources S and multiple drains D can be arranged in the direction D3. In this case, the dimension of the drain D of the first transistor 301 in the direction D3 can be understood as the dimension W of one of the drains D in the direction D3. By making greater the dimension W of the drain D of the first transistor 301 in the direction D3, the upper surface of the gate G of the first transistor 301 and the lower surface of the drain D of the first transistor 301 have a larger face-to-face area, so that the first rated capacitance Cgd1 is higher than the second rated capacitance Cgd2.

Referring to FIG. 1, FIG. 4, and FIG. 5, in one embodiment, in the vertical direction D2 of the cross-section of the display panel 100, the gate insulating layer 703 is located between the gate G and the drain D of each of the transistors 300. The gate insulating layer 703 includes a first gate insulating portion located between the drain D and the gate G of the first transistor 301, a second gate insulating portion located between the drain D and the gate G of the second transistor 302. A thickness of the first gate insulating portion is less than a thickness of the second gate insulating portion.

In the cross-section of the display panel 100, a sum of the thickness E of the gate insulating layer 703 and a thickness of the active portion 303 can be understood as the distance between the gate G and the drain D in the vertical direction D2, that is to say, the sum is the distance d between the plates corresponding to the rated capacitance Cgd formed between the upper surface of the gate G and the lower surface of the drain D. In the present embodiment, the thickness of the first gate insulating portion is less than the thickness of the second gate insulating portion. In other words, the distance d between the plates corresponding to the first rated capacitance Cgd1 is relatively small, so that the first rated capacitance Cgd1 is greater than the second rated capacitance Cgd2, and as a result, the voltage jump ΔVp1 on the first data line 101 is close to or substantially equal to the voltage jump ΔVp2 on the second data line 102, thus preventing a big difference in brightness jump between the corresponding two areas in the display panel 100 and improving the uniformity of the display screen of the display panel 100. The thickness H of the gate G can be configured as described above through, but not limited to, processes such as deposition and photolithography. Certainly, the thickness of the first gate insulating portion can be made to be smaller by making a plurality of grooves defined in a top of the first gate insulating portion.

In particular, with reference to FIGS. 2 to 5, based on the above discussion, the distance C between the gate G and the drain D of the first transistor 301 is set smaller, and the dimension B of the orthographic projection of the drain D of the first transistor 301 projected on the gate G of the first transistor 301 is set larger. Such configuration is based on the premise that, in the horizontal direction D1 of the cross section of the display panel, a dimension F of the gate G of the first transistor 301 is equal to a dimension F of the gate G of the second transistor 302. In other words, a width of the gate G of the first transistor 301 is equal to a width of the gate G of the second transistor 302. Further, in the first direction D1, the dimensions F of the gates G of the transistors 300 are equal to each other. Specifically, by reasonably setting the dimension of the drain D in the horizontal direction D1, and by setting the drain D closer to or farther from the gate G in the horizontal direction, the distance C between the gate G and the drain D of the transistor 300 can be changed, and the dimension B of the orthographic projection of the drain D of the transistor 300 projected on the gate G of the transistor 300 can be changed. It can be understood that when the dimension F of the gate G of the transistor 300 in the horizontal direction D1 changes, various characteristics of the transistor 300 change nonlinearly and cannot be well controlled. Therefore, the above configurations can improve the reliability and work function uniformity of the transistors 300.

The present invention also provides an electronic terminal which includes the display panel as described in any one of the above embodiments.

The present invention provides a display panel and an electronic terminal. The first rated capacitance formed between the first data line and the gate of the first transistor is higher than the second rated capacitance formed between the second data line and the gate of the second transistor. Therefore, when the voltage of the gate of the transistor jumps, the voltage jump on the first data line is close to or substantially equal to the voltage jump on the second data line, thereby preventing a big difference in brightness jump between the corresponding two different areas in the display panel and improving the uniformity of the display screen of the display panel.

The display panel and the electronic terminal are described in detail as above. In the present disclosure, specific examples have been used to illustrate the working principles and embodiments of the present invention. The description of the above embodiments is only for ease of understanding the technical solutions and main ideas of the present invention. Those of ordinary skill in the art should understand that: modifications can be made to the technical solutions described in the foregoing embodiments, or equivalent replacements can be made to some of the technical features of the foregoing embodiments based on the inventive concept of the present application. Such modifications or replacements should be deemed to fall within the protection scope of the present invention.

What is claimed is:

1. A display panel, comprising:

a display area and a non-display area disposed on at least one side of the display area;

a plurality of data lines disposed in the display area, the data lines comprising a first data line and a second data line, wherein a length of the first data line is greater than a length of the second data line;

a plurality of source lines disposed in the non-display area; and a plurality of demultiplexers disposed in the non-display area and connected between the source lines and the data lines, wherein each of the demultiplexers comprises multiple transistors;

wherein each of the transistors comprises a drain and a gate; the transistors comprise a first transistor connected to the first data line, and a second transistor connected to the second data line, a first rated capacitance is formed between the first data line and the gate of the first transistor, a second rated capacitance is formed between the second data line and the gate of the second transistor, and the first rated capacitance is higher than the second rated capacitance;

wherein an overlapping area of the drain and the gate of the first transistor in an area where the gate and the drain of the first transistor are arranged face to face is greater than an overlapping area of the drain and the gate of the second transistor in an area where the gate and the drain of the second transistor are arranged face to face;

wherein each of the first transistor and the second transistor comprises an active portion; in each of the first transistor and the second transistor, the gate is disposed on one side of the active portion, and the drain is disposed on one side of the gate away from the active portion; the drain comprises a first portion and a second portion, and the second portion is connected between the first portion and the active portion;

wherein an area of an orthographic projection of the gate of the first transistor projected on the corresponding second portion is larger than an area of an orthographic projection of the gate of the second transistor projected on the corresponding second portion; and wherein a thickness of the gate of the first transistor is greater than a thickness of the gate of the second transistor.

2. The display panel according to claim 1, wherein the display panel comprises a substrate; in each of the transistors, the gate is located on one side of the active portion away from the substrate; and a spacing between the gate and the drain of the first transistor in a direction from the gate of the first transistor to the corresponding second portion is less than a spacing between the gate and the drain of the second transistor in a direction from the gate of the second transistor to the corresponding second portion.

3. The display panel according to claim 1, wherein the display panel comprises a substrate; in each of the transistors, the gate is located on one side of the active portion close to the substrate; and the overlapping area of the drain and the gate of the first transistor is larger than the overlapping area of the drain and the gate of the second transistor.

4. The display panel according to claim 3, wherein a size of an orthographic projection of the drain of the first transistor projected on the gate in a direction from the gate of the first transistor to the corresponding second portion is larger than a size of an orthographic projection of the drain of the second transistor projected on the gate in a direction from the gate of the second transistor to the corresponding second portion.

5. The display panel according to claim 3, further comprising:

a gate insulating layer disposed between the gates and the drains of the transistors, comprising a first gate insulating portion disposed between the drain and the gate of the first transistor and comprising a second gate insulating portion disposed between the drain and the gate of the second transistor;

wherein a thickness of the first gate insulating portion is less than a thickness of the second gate insulating portion.

6. The display panel according to claim 2, wherein a width of the gate of the first transistor is equal to a width of the gate of the second transistor.

7. The display panel according to claim 1, wherein in each of the transistors, a thickness of the drain is greater than a thickness of the gate.

8. The display panel according to claim 2, wherein in a direction perpendicular to a cross section of the display panel, a dimension of the drain of the first transistor is greater than a dimension of the drain of the second transistor.

9. The display panel according to claim 8, wherein a thickness of the drain of the first transistor is greater than a thickness of the drain of the second transistor.

10. The display panel according to claim 1, wherein in a horizontal direction of a cross section of the display panel, a distance between the gate and the drain of the first transistor is less than a distance between the gate and the drain of the second transistor.

11. The display panel according to claim 1, wherein each of the transistors further comprises a channel portion and two doped portions disposed at two sides of the channel portion, wherein each doped portion comprises a heavily doped portion and a lightly doped portion disposed between the heavily doped portion and the channel portion, and a concentration of dopants in the heavily doped portion is greater than a concentration of dopants in the lightly doped portion.

12. An electronic terminal, comprising a display panel, the display panel comprising:

a display area and a non-display area disposed on at least one side of the display area;

a plurality of data lines disposed in the display area, the data lines comprising a first data line and a second data line, wherein a length of the first data line is greater than a length of the second data line;

a plurality of source lines disposed in the non-display area; and a plurality of demultiplexers disposed in the non-display area and connected between the source lines and the data lines, wherein each of the demultiplexers comprises multiple transistors;

wherein each of the transistors comprises a drain and a gate; the transistors comprise a first transistor connected to the first data line, and a second transistor connected to the second data line, a first rated capacitance is formed between the first data line and the gate of the first transistor, a second rated capacitance is formed between the second data line and the gate of the second transistor, and the first rated capacitance is higher than the second rated capacitance;

wherein an overlapping area of the drain and the gate of the first transistor in an area where the gate and the drain of the first transistor are arranged face to face is greater than an overlapping area of the drain and the gate of the second transistor in an area where the gate and the drain of the second transistor are arranged face to face;

wherein each of the first transistor and the second transistor comprises an active portion; in each of the first transistor and the second transistor, the gate is disposed on one side of the active portion, and the drain is disposed on one side of the gate away from the active portion; the drain comprises a first portion and a second portion, and the second portion is connected between the first portion and the active portion;

wherein an area of an orthographic projection of the gate of the first transistor projected on the corresponding second portion is larger than an area of an orthographic projection of the gate of the second transistor projected on the corresponding second portion; and wherein a thickness of the gate of the first transistor is greater than a thickness of the gate of the second transistor.

* * * * *